(12) United States Patent
Jurchescu et al.

(10) Patent No.: US 11,211,569 B2
(45) Date of Patent: Dec. 28, 2021

(54) LASER PRINTABLE ORGANIC SEMICONDUCTOR COMPOSITIONS AND APPLICATIONS THEREOF

(71) Applicant: Wake Forest University, Winston-Salem, NC (US)

(72) Inventors: Oana Diana Jurchescu, Winston-Salem, NC (US); Peter James Diemer, Mocksville, NC (US)

(73) Assignee: WAKE FOREST UNIVERSITY, Winston-Salem, NC (US)

( * ) Notice: Subject to any disclaimer, the term of this patent is extended or adjusted under 35 U.S.C. 154(b) by 0 days.

(21) Appl. No.: 16/073,643

(22) PCT Filed: Jan. 30, 2017

(86) PCT No.: PCT/US2017/015620
§ 371 (c)(1),
(2) Date: Jul. 27, 2018

(87) PCT Pub. No.: WO2017/132665
PCT Pub. Date: Aug. 3, 2017

(65) Prior Publication Data
US 2019/0006604 A1    Jan. 3, 2019

Related U.S. Application Data

(60) Provisional application No. 62/288,834, filed on Jan. 29, 2016.

(51) Int. Cl.
*H01L 51/00* (2006.01)
*H01L 51/05* (2006.01)
*H01L 51/42* (2006.01)

(52) U.S. Cl.
CPC ...... *H01L 51/0074* (2013.01); *H01L 51/0013* (2013.01); *H01L 51/0055* (2013.01);
(Continued)

(58) Field of Classification Search
CPC ............ H01L 27/0277; H01L 27/0722; H01L 29/1083; H01L 29/0649; H01L 23/5286;
(Continued)

(56) References Cited

U.S. PATENT DOCUMENTS 4,734,350 A * 3/1988 Lin .................... G03G 9/09775
428/404
2005/0214963 A1* 9/2005 Daniels .................. H01L 24/29
438/29
(Continued)

FOREIGN PATENT DOCUMENTS

EP    0362859 A2   4/1990
WO   20040107472 A1   12/2004

OTHER PUBLICATIONS

International Search Report and Written Opinion corresponding to PCT/US2017/015620, dated Apr. 6, 2017, 14 pages.
(Continued)

*Primary Examiner* — Dale E Page
*Assistant Examiner* — Quovaunda Jefferson
(74) *Attorney, Agent, or Firm* — J. Clinton Wimbish; Nexsen Pruet, PLLC

(57) ABSTRACT

Organic semiconductor compositions (OSCs) compatible with laser printing techniques are described herein. In being compatible with laser printing techniques, the OSCs are in particulate form and generally comprise an organic semiconductor component and carrier. The organic semiconductor component can comprise any small molecule semiconductor or polymeric semiconductor not inconsistent with the laser printing methods.

22 Claims, 7 Drawing Sheets

(52) U.S. Cl.
CPC ...... *H01L 51/0094* (2013.01); *H01L 51/0004* (2013.01); *H01L 51/0026* (2013.01); *H01L 51/0097* (2013.01); *H01L 51/0558* (2013.01); *H01L 51/0566* (2013.01); *H01L 51/4253* (2013.01); *Y02E 10/549* (2013.01)

(58) Field of Classification Search
CPC ............. H01L 51/0074; H01L 51/0055; H01L 51/0094; H01L 51/0013; H01L 51/0558; H01L 51/0004; H01L 51/0026; H01L 51/0097; H01L 51/0566; H01L 51/4253; Y01E 10/549
See application file for complete search history.

(56) References Cited

U.S. PATENT DOCUMENTS

| | | | |
|---|---|---|---|
| 2005/0279996 | A1 | 12/2005 | Takubo et al. |
| 2006/0261331 | A1* | 11/2006 | Yukawa ................... H01L 27/10 257/40 |
| 2007/0090387 | A1* | 4/2007 | Daniels ................... H01L 24/75 257/99 |
| 2007/0134574 | A1 | 6/2007 | Lee et al. |
| 2009/0166590 | A1* | 7/2009 | Meng ..................... B82Y 10/00 252/500 |
| 2015/0243916 | A1* | 8/2015 | Jurchescu ........... H01L 51/0512 438/82 |
| 2016/0351642 | A1* | 12/2016 | Dykaar .................... H01L 31/00 |
| 2016/0353578 | A1* | 12/2016 | Yang ...................... H05K 3/125 |

OTHER PUBLICATIONS

Rapp, Ludovic et al., Pulsed-laser printing of organic thin-film transistors, Applied Physics Letters, A I P Publishing LLC, U.S., vol. 95, No. 17, Oct. 29, 2009, 3 pages, XP012126195, ISSN: 0003-6951.

Rapp, Ludovic et al., Laser-induced forward transfer of polythiophene-based derivatives for fully polymeric thin film transistors, Organic Electronics, vol. 15., No. 8., May 11, 2014, pp. 1868-1875, XP028872000, ISSN: 1566-1199.

Rapp, L. et al., Laser printing of air-stable high performing organic thin film transistors, Organic Electronics, vol. 13., No. 10, Jun. 28, 2012, pp. 2035-2041, XP055359145, NL, ISSN: 1566-1199.

Lee, Simmons, Inside Laser Printer Toner: Wax, Static, Lots of Plastic: Wired, Wired Magazine, Mar. 23, 2015, XP055359850, Retrieved from the Internet: URL:https://www.wired.com/2015/03/whats-inside-printer-toner/, [retrieved on Mar. 29, 2017], whole document.

Shao, Y. et al., The Effect of Transfer Printing on Pentacene Thin-Film Crystal Structure, arxiv.org., Cornell University Library, 201 Olin Library Cornell University, Ithaca, NY, 14853, 5 pages, Feb. 6, 2008, XP080226308.

\* cited by examiner

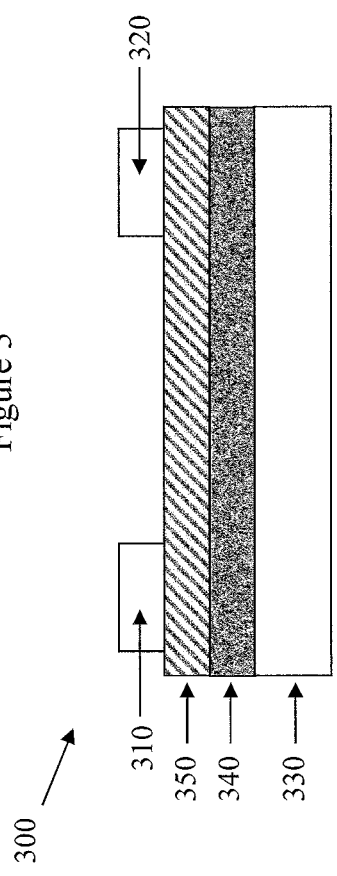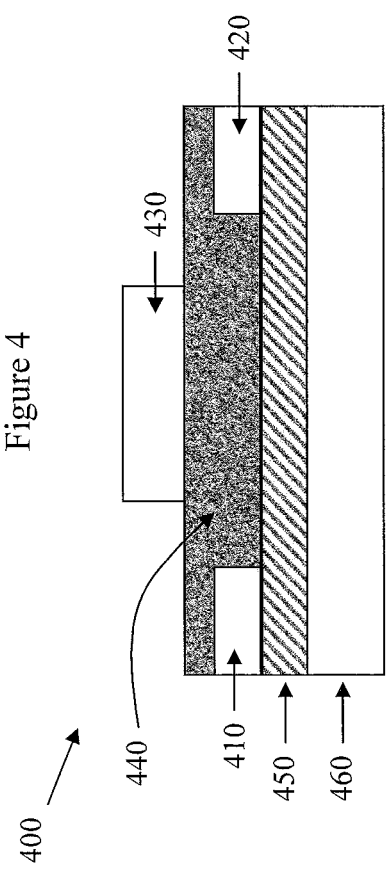

LASER PRINTABLE ORGANIC SEMICONDUCTOR COMPOSITIONS AND APPLICATIONS THEREOF

RELATED APPLICATION DATA

This application is a U.S. National Phase of PCT/US2017/015620, filed Jan. 30, 2017, which claims priority pursuant to 35 U.S.C. § 119(e) to U.S. Provisional Patent Application Ser. No. 62/288,834 filed Jan. 29, 2016, each of which is incorporated herein by reference in its entirety.

STATEMENT OF GOVERNMENT RIGHTS

This invention was made with government support under contract CMMI-1537080 awarded by the National Science Foundation. The government has certain rights in the invention.

FIELD

The present invention relates to organic semiconductor compositions (OSCs) and, in particular, to OSCs compatible with laser printing techniques for the fabrication of various electronic devices, including thin film transistors.

BACKGROUND

Organic electronics have the potential to expand beyond conventional silicon to provide a platform for the next generation large-area, low-weight flexible optoelectronic applications, including flexible displays, electronic paper, sensors, disposable and wearable electronics, renewable energy sources, medical applications, and more. The unique properties of organic materials endorse new paradigms for device manufacturing that significantly reduce processing complexity. Fast deposition using roll-to-roll processing may allow large-volume production at low cost per unit area, realizing the truly transformative concept of "electronics everywhere." However, commercialization is hindered by inadequate performance, poor scalability and insufficient reproducibility.

The modest performance of organic devices is often not intrinsic to their constituent materials. Several OSCs, for example, have demonstrated mobilities as high as 40 $cm^2$/Vs, but the processing of these materials adopts vacuum and high temperature processes that preclude rapid, low-cost device fabrication, and limit the compatible substrates. This represents a significant drawback, as the use of OSCs in consumer applications implies requirements not only of high performance, but also inexpensive process ability. Chemical modifications of these compounds increased their solubility and allowed their processing from solution, which significantly reduced the manufacturing complexity and cost. Soluble small-molecule organic semiconductors, together with polymeric organic semiconductors, have quickly become viable options for use in conjunction with low-cost deposition techniques such as spin-coating, ink-jet printing, spray-coating and more.

Solution processability brings a key competitive advantage, allowing fabrication under ambient atmospheric conditions and compatibility with flexible substrates like plastics, fabric, or paper, but unfortunately, it also raises serious problems. First, OSCs are only soluble in aromatic and/or halogenated solvents, which present environmental and safety hazards, making their use in large scale manufacturing processes unattractive. Second, the dynamic and complex process of film crystallization from solution often yields a complex microstructure and a large number of polymorphs. It is quite common for OSCs, including some of the highest performers, to exhibit mobilities spanning several orders of magnitude, depending on deposition method, solvent employed and/or chemistry at the interfaces. Furthermore, spatial differences in film quality across a device substrate can lead to unacceptably large performance variation between devices, further hampering manufacturing. Therefore, the technological advantages that solution processing brings to device manufacture, cannot outweigh the lack of control and often dramatic decrease in performance observed from such solution-cast films.

SUMMARY

In view of the foregoing disadvantages associated with solution processing, OSCs compatible with laser printing techniques are described herein. Such OSCs can enable facile and economic production of a variety of electronic devices including, but not limited to, thin film transistors, light emitting diodes and photovoltaics. In being compatible with laser printing techniques, OSCs described herein are in particulate form and generally comprise an organic semiconductor component and carrier. The organic semiconductor component can include one or more organic semiconducting species, such as small molecule semiconductors, polymeric semiconductors and various combinations thereof. An OSC, in some embodiments, further comprises a charge control additive facilitating proper deposition of the OSC on the photoreceptor drum of the laser printer during development.

In another aspect, methods of fabricating organic electronic devices are described herein. In some embodiments, a method of fabricating an organic electronic device comprises providing a particulate OSC comprising an organic semiconductor component and carrier and depositing the particulate OSC on one or more selected regions of a charged photoreceptor drum of a printer. The one or more deposition regions can be defined by exposing the charged photoreceptor drum to a light source, such as a laser or light emitting diode (LED). The particulate OSC is subsequently transferred from the photoreceptor drum to a substrate of the electronic device. Once transferred, a fuser assembly is employed to fuse the particles of the OSC. Fusion of the OSC can include melting and/or solvent-vapor fusing one or more components of the composition. For example, the organic semiconductor component and carrier can be melted during fusion. Upon melting and subsequent cooling, the organic semiconductor component can undergo re-crystallization and zone refinement, producing a semiconductor layer with enhanced carrier mobilities. Importantly, deposition and refinement of the OSC into a semiconductor layer of an electronic device occurs in a single process, thereby obviating solution deposition methods and subsequent recrystallization and refinement steps.

These and other embodiments are described in greater detail in the detailed description which follows.

BRIEF DESCRIPTION OF THE DRAWINGS

FIG. 3 illustrates an organic thin film transistor according to one embodiment described herein.

FIG. 4 illustrates an organic thin film transistor according to one embodiment described herein.

DETAILED DESCRIPTION

Figure 1:
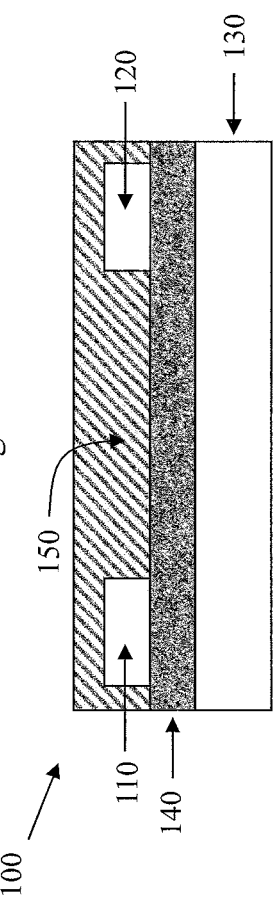
FIG. 1 illustrates an organic thin film transistor according to one embodiment described herein.

Embodiments described herein can be understood more readily by reference to the following detailed description, example, and drawings. Elements, apparatus, and methods described herein, however, are not limited to the specific embodiments presented in the detailed description, example, and drawings. It should be recognized that these embodiments are merely illustrative of the principles of the present invention. Numerous modifications and adaptations will be readily apparent to those of skill in the art without departing from the spirit and scope of the invention.

I. OSC Compositions

OSCs compatible with laser printing techniques are described herein. In being compatible with laser printing techniques, the OSCs are in particulate or powder form and generally comprise an organic semiconductor component and carrier. The organic semiconductor component can comprise any small molecule semiconductor not inconsistent with the laser printing methods. For example, in some embodiments, a small molecule semiconductor comprises one or more acenes. An acene, in some embodiments, comprises a substituted or unsubstituted naphthalene, anthracene, tetracene, pentacene, hexacene, or heptacene. In some embodiments, a small molecule semiconductor is of Formula (I):

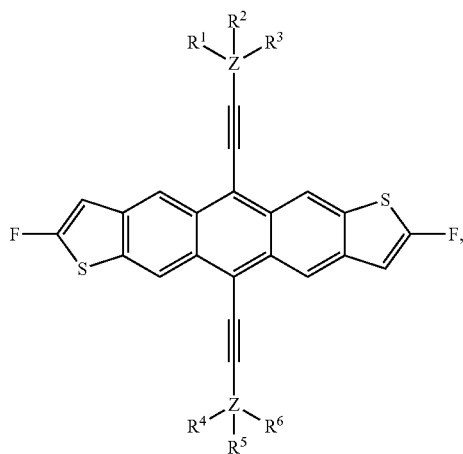

(I)

wherein Z is selected from the group consisting of Si and Ge and $R^1$-$R^6$ are independently selected from the group consisting of $C_{1-20}$ alkyl and $C_{1-20}$ alkenyl. For example, in some embodiments, the small molecule semiconductor is 2,8-difluoro-5,11-bis(triethylsilylethynyl)anthradithiophene [diF-TES-ADT]. In some embodiments, the small molecule semiconductor is 2,8-difluoro-5,11-bis(triisopropylsilyl- ethynyl) anthradithiophene [diF-TIPS-ADT] or triethylgermylethynyl-substituted anthradithiophene [diF-TEG ADT]. The small molecule semiconductor can also be 2,8-difluoro-5,11-bis(tri-sec-butylsilylethynyl)difluoro anthradithiophene. Further, the small molecule semiconductor can be of Formula (I), wherein the fluorines of the thiophenes are removed. In such embodiments, for example, the small molecule semiconductor can be [TES-ADT]. Additionally, the small molecule semiconductor can be of Formula (I), wherein the fluorines of the thiophenes are replaced with cyano functionalities producing CN-TES-ADT.

In some embodiments, a small molecule semiconductor is of Formula (II):

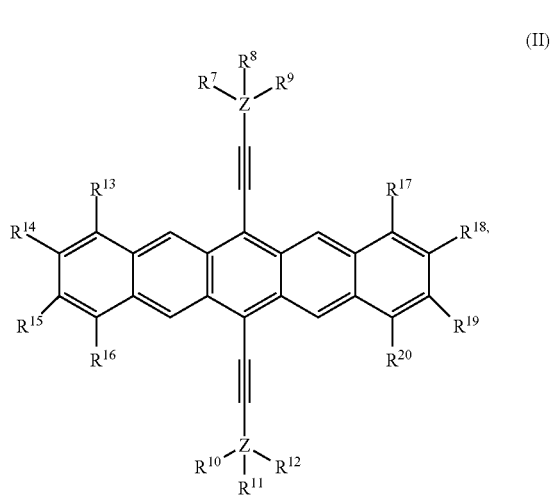

(II)

wherein Z is selected from the group consisting of Si and Ge and $R^7$-$R^{12}$ are independently selected from the group consisting of $C_{1-20}$ alkyl and $C_{1-20}$ alkenyl and $R^{13}$-$R^{20}$ are independently selected from the group consisting of hydrogen, halogen, cyano, alkyl, alklenyl, alkynyl, aryl and heteroaryl. In some embodiments, the small molecule is 6,13-bis(triisopropylsilylethynyl)pentacene or 1,2,3,4-tetrafluoro-5,11-bis(triisopropylsilylethynyl)pentacene [F4 TIPS Pn]. Similarly, the small molecule can be F2 TIPS Pn or F8 TIPS Pn.

In some embodiments, a small molecule semiconductor is of Formula (III):

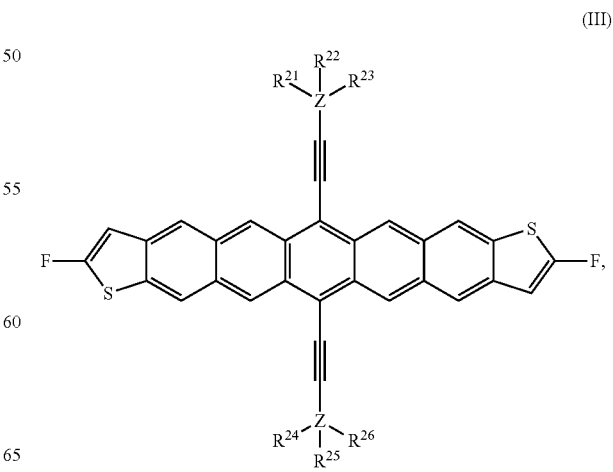

(III)

wherein Z is selected from the group consisting of Si and Ge and $R^{21}$-$R^{26}$ are independently selected from the group consisting of $C_{1-20}$ alkyl and $C_{1-20}$ alkenyl. For example, the small molecule can be 2,8-difluoro-5,11-bis(tri-sec-butylsilylethynyl) pentacenedithiophene.

Further, a small molecule semiconductor can be of Formula IV:

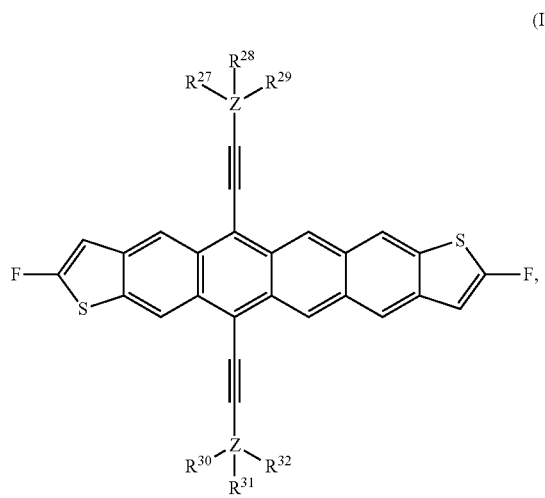

(IV)

wherein Z is selected from the group consisting of Si and Ge and $R^{27}$-$R^{32}$ are independently selected from the group consisting of $C_{1-20}$ alkyl and $C_{1-20}$ alkenyl. For example, the small molecule can be 2,8-difluoro-5,11-bis(tri-sec-butylsilylethynyl)tetracenedithiophene.

Additionally, a small molecule semiconductor can be selected from Table I.

TABLE I

Small Molecule Semiconductor 2,7-alkyl[1]benzothieno[3,2-b][1]benzothiophene (C8-BTBT)
2,9-alkyl-dinaphtho[2,3-b:2',3'-f]thieno[3,2-b]thiopliene (C 10 -DNTT)
N,N-1H,1H-perfluorobutyldicyanoperylene-carboxydiimide (PDIF-$CN_2$)
Sexithiophene (6T)
poly[9,9'dioctyl-fluorene-co-bithiophene](F8T2)
polytriarylamine (PTAA)
poly-2,5-thienylene vinylene (PVT)
α,ω-dihexylquinquethiophene (DH-5T)
α,ω-dihexylsexithiophene (DH-6T)
perfluorocopperphthalocyanine (FPcCu)
3',4'-dibutyl-5,5''-bis(dicyanomethylene)-5,5''-dihydro-2,2':5',-2''-terthiophene (QM3T)
α,ω-diperfluorohexyloligothiophene (DFH-nT)
2,7-[bis(5-perfluorohexylcarbonylthien-2-yl)]-4H-cyclopenta-[2,1-b:3,4-b']-dithiophen-4-one (DFHCO-4TCO)
Poly[bisbenzimidazobenzophenanthroline] (BBB)
α,ω-diperfluorophenylquaterthiophene (FTTTTF)
dicyanoperylene-bis[dicarboximide] (DPI-CN)
naphthalene tetracarboxylic diimide (NTCDI)
Tetracene
Anthracene
Tetrathiafulvalene (TTF)
Poly(3-alkythiophene)
Dithiotetrathiafulvalene (DT-TTF)
Cyclohexylquaterthiophene (CH4T)

In other embodiments, the organic semiconductor component can comprise a polymeric semiconductor. Any polymeric semiconductor not inconsistent with the laser printing techniques described herein can be employed. Various conjugated polymeric systems, for example, can be used in the organic semiconductor component. In further embodiments, the organic semiconductor component can comprise various mixtures of small molecule semiconductor and polymeric semiconductor in particulate or powder form.

The OSC also comprises a carrier. Any carrier compatible with the organic semiconducting component and laser printing techniques described herein can be used. In being compatible with laser printing techniques, the carrier is in particulate or powder form. Suitable carriers can be selected according to several considerations including, but not limited to, identity of the organic semiconductor component, temperatures and/or pressures applied in the printing process and acceptable viscosity during the fusion process. In some embodiments, a carrier comprises one or more waxes. Suitable waxes can include mixtures of aliphatic esters, aliphatic alcohols, alpha-hydroxy-esters, monohydric alcohols, dihydric alcohols and/or cinnamic aliphatic diesters. Carbon chains of these aliphatic species can generally be straight chained or branched with lengths of $C_{24}$ to $C_{34}$. In one embodiment, for example, carrier of the OSC is carnauba wax or carnauba wax mixed with other wax, such as beeswax. In some embodiments, a carrier comprises one or more types of commercially available toner for laser printers. Toner can generally comprise carbon powder mixed with one or more metals or metal oxides, such as iron oxide. Toner, in some embodiments, can also employ heat sensitive plastic powder particles. In some embodiments, toner comprises pigment for coloration.

The carrier and organic semiconductor component can be combined in any ratio to form the OSC. In some embodiments, the ratio of carrier to organic semiconductor component ranges from 0.5:10 to 10:0.5. Depending on the identity of the carrier and/or organic semiconductor, various combination techniques can be employed to provide an OSC. In some embodiments, for example, particles of one or more waxes are processed to form a wax emulsion. The wax emulsion can be ultrasonicated to provide a colloid of wax particles. Powder organic semiconductor can be added to the colloid of wax particles followed by ultrasonication. The resulting mixture can be spray dried to provide the OSC. In other embodiments, powder organic semiconductor can be mixed with commercially available toner and milled, such as by ball milling, to provide an OSC.

The OSC, in some embodiments, can further comprise a charge control additive. The charge control additive can facilitate proper deposition of the OSC on the photoreceptor drum and inhibit particle agglomeration, thereby enhancing flow characteristics of the OSC. Charge control additive can be selected according to several considerations including, but not limited to, compositional identity of the organic semiconductor component and carrier and processing conditions of the printing process. In some embodiments, for example, a charge control additive is hexamethyldisilazane (HDMS) treated fumed silica. As described in the following section, OSCs can be employed in laser printing techniques for the fabrication of various electronic devices, including thin film transistors.

II. Organic Electronic Device Fabrication

In another aspect, methods of fabricating organic electronic devices are described herein. In some embodiments, a method of fabricating an organic electronic device comprises providing a particulate OSC comprising an organic semiconductor component and carrier and depositing the particulate OSC on one or more selected regions of a charged photoreceptor drum of a printer. The particulate OSC, for example, can be placed in a toner cartridge of a laser printer. The one or more deposition regions can be defined by exposing the charged photoreceptor drum to a light source, such as a laser or light emitting diode (LED). The particulate OSC is subsequently transferred from the photoreceptor drum to a substrate of the electronic device. Once transferred, a fuser assembly is employed to fuse the particles of the OSC. Fusion of the OSC can include melting one or more components of the composition. For example, the organic semiconductor component and/or carrier can be melted during fusion. Upon melting and subsequent cooling, the organic semiconductor component can undergo re-crystallization and zone refinement, producing a semiconductor layer with enhanced carrier mobilities. Alternatively, the organic semiconductor component and/or carrier can be heated above their respective glass transition temperatures, but not melted. Upon heating to or above the glass transition temperature and subsequent cooling, the organic semiconductor component can undergo re-crystallization and zone refinement, producing a semiconductor layer with enhanced carrier mobilities. Importantly, deposition and refinement of the OSC into a semiconductor layer of an electronic device occurs in a single process, thereby obviating solution deposition methods and subsequent recrystallization and refinement steps. Alternatively, fusion can include solvent-vapor fusing where melting of the organic semiconductor component and carrier does not occur. Solvent-vapor fusion can also provide mechanisms for re-crystallization of the organic semiconductor component.

OSCs described herein can be laser printed on a variety of substrates. Suitable substrates can be selected according to several considerations including, but not limited to, wettability of substrate surfaces by the deposited OSC, mechanical and/or chemical requirements of the electronic device incorporating the substrate and the type or function of the electronic device. In some embodiments, substrates comprise one or more dielectric materials. Dielectric materials can include glass as well as thermoplastics and thermosets. In some embodiments, thermoplastics comprise polyolefins, polycarbonate, polystyrene and polyethylene terephthalate. Dielectric substrates on which OSCs are laser printed can serve as dielectric layers in electronic devices, including field effect transistors and photovoltaics. In some embodiments, substrates comprise cellulosic materials, such as various grades of paper. In one embodiment, for example, a substrate can be paper typically used for laser printing applications. In some embodiments, OSCs can be deposited directly on paper substrates. Alternatively, paper substrates may be surface treated with one or more compositions promoting OSC spreading and/or adhesion to the paper. In some embodiments, paper substrates can be provided a hydrophobic coating for enhancing OSC wetting and promoting deposition of a semiconductor layer of uniform thickness and/or composition. Hydrophobic coatings can be formed from waxes and/or hydrophobic polymeric materials.

A substrate for OSC deposition can have any desired thickness. Substrate thickness can be selected according to several considerations including, but not limited to, type of electronic device being fabricated, device dimensions and mechanical requirements of the device operating environment. In some embodiments, a substrate has thickness of 0.5 µm to 1 cm. Substrates may also have thickness selected from Table II.

TABLE II

| Substrate Thickness |
| --- |
| 1 µm-10 mm |
| 10 µm-1 mm |
| 50 µm-750 µm |
| 100 µm-500 µm |
| 100 µm-1 mm |
| 500 µm-2 mm |

A variety of electronic devices can be fabricated via deposition of semiconductor layers by laser printing techniques. Electronic structures, such as channels of thin film transistors and circuitry, can be patterned on substrates without complex masking, etching and/or other solution processing techniques. FIGS. 1-4 illustrate various designs of thin film transistors in which the OSC film is deposited according to techniques described herein. The organic thin film transistor (100) of FIG. 1 comprises a source terminal (110), a drain terminal (120), and a gate terminal (130). A dielectric layer (140) is positioned between the gate terminal (130) and the source and drain terminals (110, 120). A laser printed OSC film (150) is in electrical communication with the source terminal (110) and drain terminal (120). If desired, a work function alteration layer (not shown) can be positioned between the source terminal (110) and the OSC film (150) and/or between the drain terminal (120) and the OSC film (150). For example, in some embodiments, a work function alteration layer comprises a self-assembled monolayer (SAM) positioned on one or more surfaces of the source terminal, drain terminal, or both.

Figure 2:
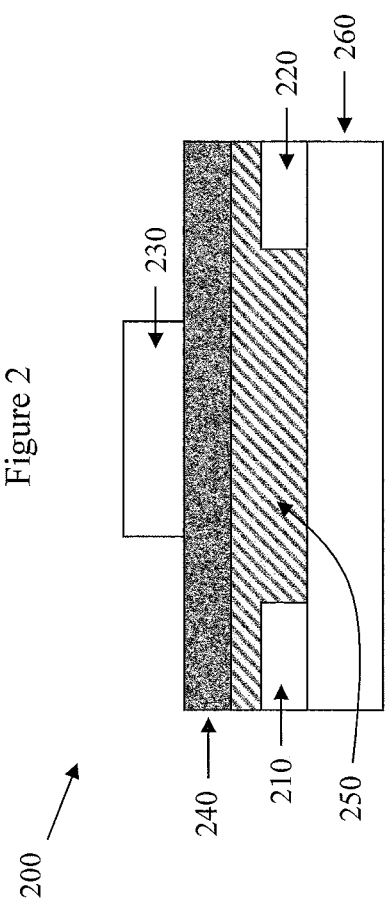
FIG. 2 illustrates an organic thin film transistor according to one embodiment described herein.

FIG. 2 illustrates an alternative structure of an organic thin film transistor according to another embodiment described herein. Organic thin film transistor (200) comprises a source terminal (210), a drain terminal (220), and a gate terminal (230). A dielectric layer (240) is positioned between the gate terminal (230) and the source and drain terminals (210, 220). A laser printed OSC film (250) is in electrical communication with the source terminal (210) and the drain terminal (220). The OSC film (250) is positioned between the source and drain terminals (210, 220) and the dielectric layer (240). If desired, a work function alteration layer (not shown) can be positioned between the source terminal (210) and the OSC film (250) and/or between the drain terminal (220) and the OSC film (250). In the embodiment of FIG. 2, organic film transistor (200) further comprises an insulating substrate (260) adjacent to the source and drain terminals (210, 220). Any insulating substrate not inconsistent with the objectives of the present invention may be used. In some embodiments, insulating substrate (260) comprises glass such as $SiO_2$.

The various components of an organic thin film transistor described herein are not necessarily limited to the structures of FIGS. 1 and 2. Other device structures not inconsistent with the objectives of the present invention may also be used. FIG. 3 illustrates another structure of an organic thin film transistor according to one embodiment described herein. Organic thin film transistor (300) comprises source (310) and drain (320) terminals over and in electrical communication with a laser printed OSC film (350). A dielectric layer (340) is positioned between the OSC film (350) and gate terminal (330). If desired, a work function alteration layer (not shown) can be positioned between the source terminal (310) and the OSC film (350) and/or between the drain terminal (320) and the OSC film (350).

FIG. 4 illustrates another structure of an organic thin film transistor according to one embodiment described herein.

Organic thin film transistor (400) comprises source (410) and drain (420) terminals over and in electrical communication with a laser printed OSC film (450). A dielectric layer (440) is positioned between the gate terminal (430) and source and drain terminals (410, 420). If desired, a work function alteration layer (not shown) can be positioned between the source terminal (410) and the OSC film (450) and/or between the drain terminal (420) and the OSC film (450).

Turning now to specific components, the thin film transistor comprises a substrate on which the OSC film is printed according to methods described herein. Any dielectric substrate not inconsistent with laser printing methods can be used. In some embodiments, the substrate is a polymeric material such as polyethylene terephthalate (PET). Moreover, the source and drain terminal can comprise pure metal or a metal alloy. In some embodiments, for example, the source and/or drain terminals are gold, silver, copper, titanium or aluminum or a combination thereof. Source and drain terminals can also have any physical dimensions not inconsistent with the objectives of the present invention. In some embodiments, for example, a source and/or drain terminal has a thickness of about 10 nm to about 200 nm. In some embodiments, a source and/or drain terminal has a thickness of about 20 nm to about 150 nm, or about 30 nm to about 100 nm. In some embodiments, a source and/or drain terminal has a thickness greater than about 200 nm. Moreover, in some embodiments, one or more dimensions of a source and/or drain terminal can be selected to achieve a desired channel length or width in the organic film.

A gate terminal of a thin film transistor described herein can comprise any material suitable for serving as a gate terminal. In some embodiments, for instance, a gate terminal comprises a semiconductor. A semiconductor gate terminal, in some embodiments, comprises a doped semiconductor such as doped silicon. A doped semiconductor, in some embodiments, can be n-type or p-type. In some embodiments, a gate terminal is metal. A metal terminal can be pure metal or an alloy. In some embodiments, a metal terminal is gold, silver, copper, or aluminum. Alternatively, a gate terminal can be a conducting oxide, such as indium tin oxide (ITO). A gate terminal can also have any physical dimensions not inconsistent with the objectives of the present invention. In some embodiments, for example, a gate terminal has a thickness of about 500 µm to about 1 mm.

As described in FIGS. 1-4, an organic thin film transistor can further comprise a work function alteration layer positioned between the printed OSC film and at least one of the source terminal and drain terminal and the organic film Any work function alteration layer not inconsistent with the objectives of the present invention may be used. A work function alteration layer, in some embodiments, is operable to alter the work function or charge injection of a source and/or drain terminal. In some embodiments, for example, a work function alteration layer assists in reconciling the electronic structure of the source or drain terminal with the printed OSC film, thereby improving charge injection.

In some embodiments, a work function alteration layer comprises a self-assembled monolayer (SAM) formed between a terminal and the OSC. Moreover, in some embodiments, a SAM can comprise a small molecule monolayer. In some embodiments, a work function alteration layer comprises a self-assembled monolayer of a fluorinated compound. In some embodiments, the fluorinated compound is a fluorinated thiol, such as pentafluorobenzenethiol. Use of a work function alteration layer described herein, in some embodiments, enhances the carrier mobility of the transistor.

An organic thin film transistor described herein also comprises a dielectric layer positioned between the gate terminal and the source and drain terminals. Any dielectric layer not inconsistent with the objectives of the present invention may be used. In some embodiments, for example, a dielectric layer is formed from an organic material, such as a dielectric organic polymer. Suitable dielectric organic polymer can include amorphous fluoropolymer such as Cytop commercially from Asahi Glass. In other embodiments, a dielectric layer is formed from an inorganic material, including inorganic oxides such as alumina or silica. In some embodiments, a dielectric layer is formed from an oxidized semiconductor substrate, such as an oxidized, highly doped silicon substrate. The oxidation, in some embodiments, comprises surface oxidation. In some embodiments, a dielectric layer comprises $SiO_2$. Further, a dielectric layer can have any thickness not inconsistent with the objectives of the present invention. In some embodiments, for example, a dielectric layer has a thickness of about 50 nm to about 50 µm. Moreover, a dielectric layer described herein, in some embodiments, comprises an oxide having a thickness of about 50 nm to about 1 mm.

In some embodiments, an organic thin film transistor described herein further comprises a surface energy alteration layer positioned between the printed OSC film and one or more dielectric layers of the transistor. With reference to FIG. 1, a surface energy alteration layer can be positioned between the printed OSC film (150) and dielectric layer (140). Alternatively, with reference to FIG. 2, a surface energy alteration layer, in some embodiments, is positioned between the insulating or dielectric substrate (260) and OSC film (250). Surface energy alteration layers can also be positioned between OSC films and dielectric layers of the transistors of FIGS. 3 and 4.

A surface energy alteration layer, in some embodiments, lowers the surface energy of the dielectric layer. For example, a surface energy alteration layer can comprise one or more species operable to increase the hydrophobic character of the dielectric surface. In some embodiments, for example, a surface energy alteration layer comprises organic silanes including, but not limited to, organic trichlorosilanes and hexamethyldisilazane (HMDS). Organic trichlorosilanes can comprise octadecyltrichlorosilane (OTS), 7-octenyltricholosilane (VTS), (tridecafluoro-1,1,2,2-tetrahydrooctyl)trichlorosilane (FTS) or benzyltrichlorosilane (BTS). Chemical species of the surface energy alteration layer, in some embodiments, form self-assembled monolayers.

Thin film transistors fabricated according to laser printing methods described herein, in some embodiments, exhibit carrier mobility ($\mu_{eff}$) selected from Table III.

TABLE III

| Carrier Mobility (cm$^2$/Vs) $\mu_{eff}$ |
|---|
| ≥0.01 |
| ≥0.1 |
| ≥1 |
| ≥2 |
| ≥3 |
| 1-5 |
| 2-4 |
| ≥5 |

Additionally, a field effect transistor described herein can generally exhibit a threshold voltage ($V_T$) of −15V to 15V. In some embodiments, a field effect transistor exhibits $V_T$ selected from Table IV.

TABLE IV

| Threshold Voltage ($V_T$) |
| --- |
| −10 to 10 |
| −5 to 5 |
| −3 to 3 |
| −2 to 2 |
| −1 to 1 |

Moreover, in some embodiments, a field effect transistor described herein has a subthreshold swing (S) of less than about 1 V/dec, such as 0.1 to 1 V/dec or 0.5 to 1 V/dec. In other embodiments, S is greater than 1 V/dec, including values up to 20 V/dec. Subthreshold swing can be calculated by determining the inverse of the slope of the linear fit line of the plot of $\log(I_D)$ versus $V_{GS}$ in the saturation regime. Further, a field effect transistor described herein can exhibit an on/off ratio of $1\times10^2$ to $1\times10^8$, in some embodiments.

These and other embodiments are further illustrated by the following non-limiting example.

EXAMPLE 1

Laser Printed Thin Film Transistor

OSC toner powder was prepared by first heating 2 g of carnauba wax in 200 mL of isopropyl alcohol (IPA) in a 500 mL beaker at 180° C. and stirring for 30 minutes. The carnauba wax melted forming a clear emulsion. Next, the wax emulsion was removed from the heat and stirred and placed in an ultrasonic bath heated to 60° C. The emulsion was ultrasonicated for 20 minutes, resulting in a milky colloid of wax particles in IPA. Then, 4 g of TIPS Pn powder was added to the colloid and ultrasonicated for 20 minutes. Next, 1.6 g of HMDS treated fumed silica was added to the mixture and ultrasonicated for an additional 20 minutes. This silica was prepared by filling a 100 mL jar with fresh fumed silica of particle size roughly 200 nm followed by 200 uL of HMDS. The jar was then covered and heated to 130° C. while stirring for 30 minutes. Before the treated silica is added to the colloid mixture, it was allowed to cool back to room temperature.

The colloid of carnauba wax, TIPS Pn, and HMDS treated fumed silica in IPA was then dried in a spray drying apparatus in which the dried particles were collected in a cyclone separator. The resulting powder was poured into an empty laser printer toner cartridge for printing. The substrate on which the OSC toner was printed was polyethylene terephthalate (PET). The PET had a coating of indium tin oxide (ITO) which performed the role of the gate electrode in a bottom-gate transistor configuration. The fluoropolymer Cytop was spin coated at 1000 rpm to a thickness of 1.4 µm and heated to 110° C. for an hour in order to make the gate dielectric layer. Next, the gold was thermally evaporated through a shadow mask to define the source and drain electrodes. Squares of 2 cm by 2 cm were cut out of this substrate to yield testbeds with an array of source-drain electrodes on which the OSC active layer can be deposited. These testbed squares were adhered to a laser printer compatible transparency sheet with kapton tape. A square of the OSC toner was printed such that it covers the region in which the testbed is located. After the printing was completed as defined by the default software and drivers for the unaltered printer, the testbed is removed from the transparency and is ready for device characterization.

Figure 5:
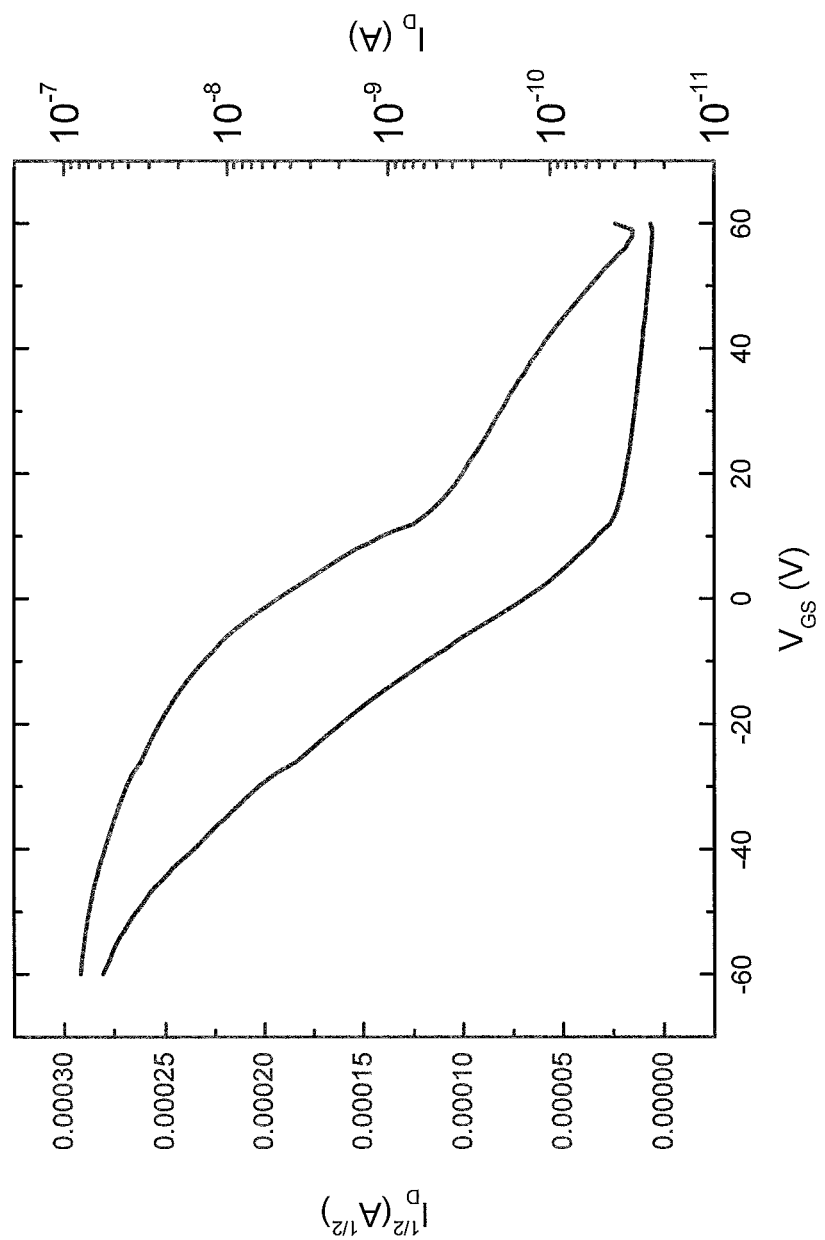
FIG. 5 illustrates current-voltage characteristics of a laser printed organic thin film transistor according to one embodiment described herein.

The electrical properties of the transistors are measured using a commercially available probe-station, and an Agilent 4155 C semiconductor parameter analyzer. The thin film transistor exhibited carrier mobility of $1.7\times10^{-3}$ cm$^2$/Vs, on/off current ratio of $10^3$, $V_T$ of 6.13V and S of 12 V/dec. FIG. 5 illustrates current-voltage characteristics of the laser printed organic thin film transistor. It is contemplated that these performance metrics can be enhanced by further developments to device design and refinements to the laser printing steps and OSCs described herein.

EXAMPLE 2

Laser Printed Thin Film Transistor on Paper

An organic semiconductor layer was laser printed on printer paper. The toner was prepared by mixing 1 g of commercially available yellow toner (from a Samsung CLP-300 laser printer) with 0.5 g TIPS pentacene. The yellow toner and TIPS pentacene powder were placed in a 20 mL scintillation vial along with 20 each of ⅛ inch diameter and 3/16 inch diameter hardened 440C stainless steel balls for the purpose of ball milling. These were ball-milled together in a rock tumbler for 10 minutes. Fumed silica (200 nm) treated with hexamethyldisilazane (HMDS) was added (0.3 g) to the mixture and ball-milled for an additional 2 hours. The resulting powder was separated from the balls with a wire mesh filter.

Figure 6:
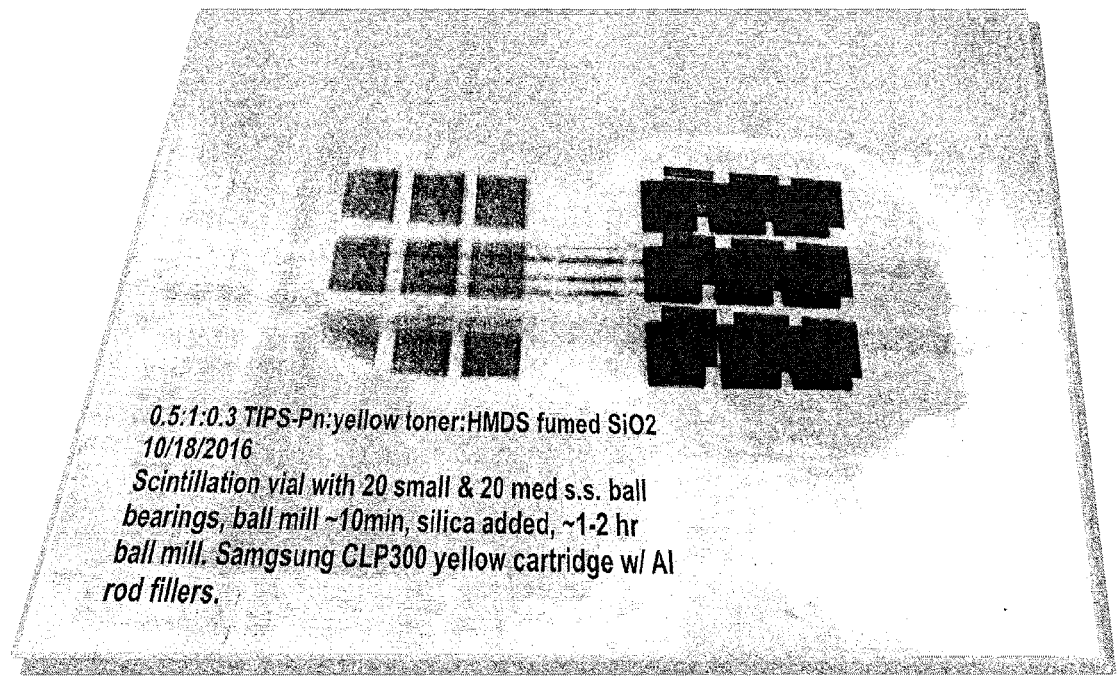
FIG. 6 illustrates a patterned array of OSC toner printed on paper having a wax coating according to some embodiments described herein.

The paper substrate was first modified by saturating the printing location with molten carnauba wax. Standard copier paper was placed on a hot plate set at 85° C. Carnauba flakes were spread on top and allowed to melt. The molten wax was brushed to evenly coat the target area. Upon cooling, the waxy paper was inserted into the Samsung CLP-300 laser printer, and a patterned array of OSC toner was printed on the surface on the area pre-soaked in the molten wax as illustrated in FIG. 6. The printed OSC toner mixed with the wax when passed through the fusing roller, producing an even coating of the OSC.

Figure 7:
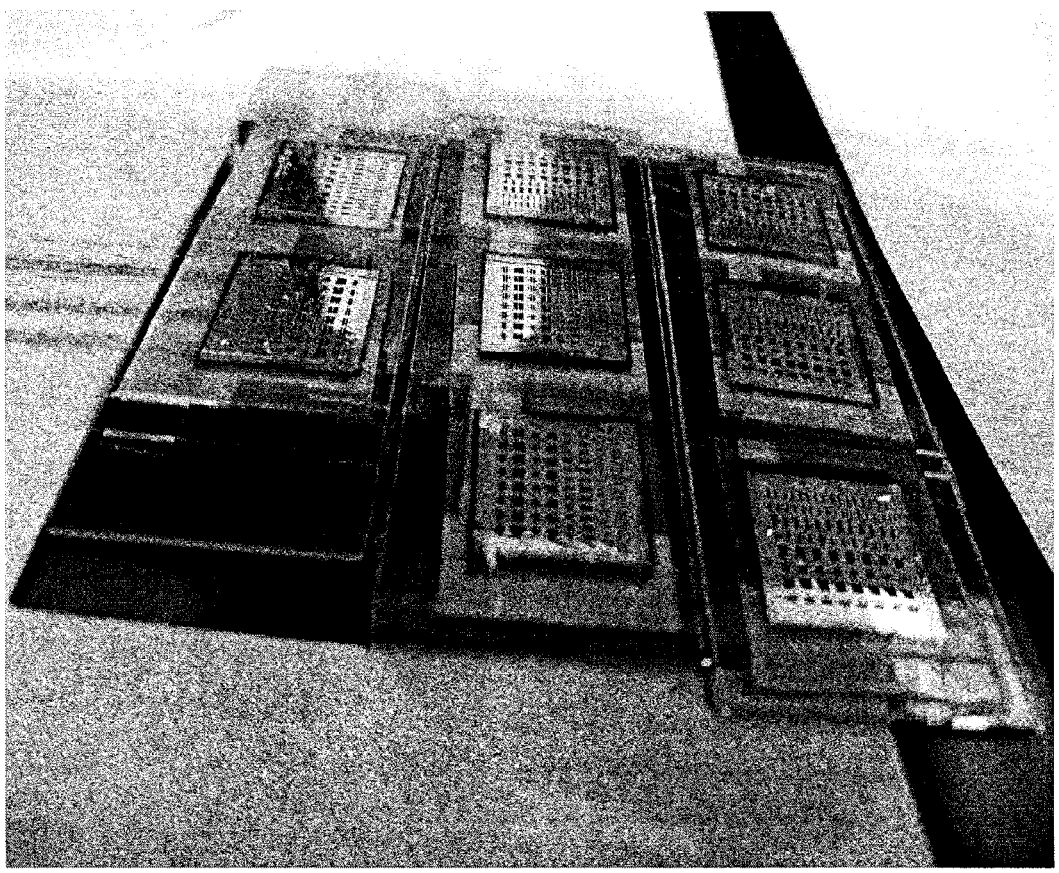
FIG. 7 illustrates gold source and drain contacts thermally evaporated over the OSC toner layer through metal foil shadow masks according to some embodiments described herein.
Figure 8:
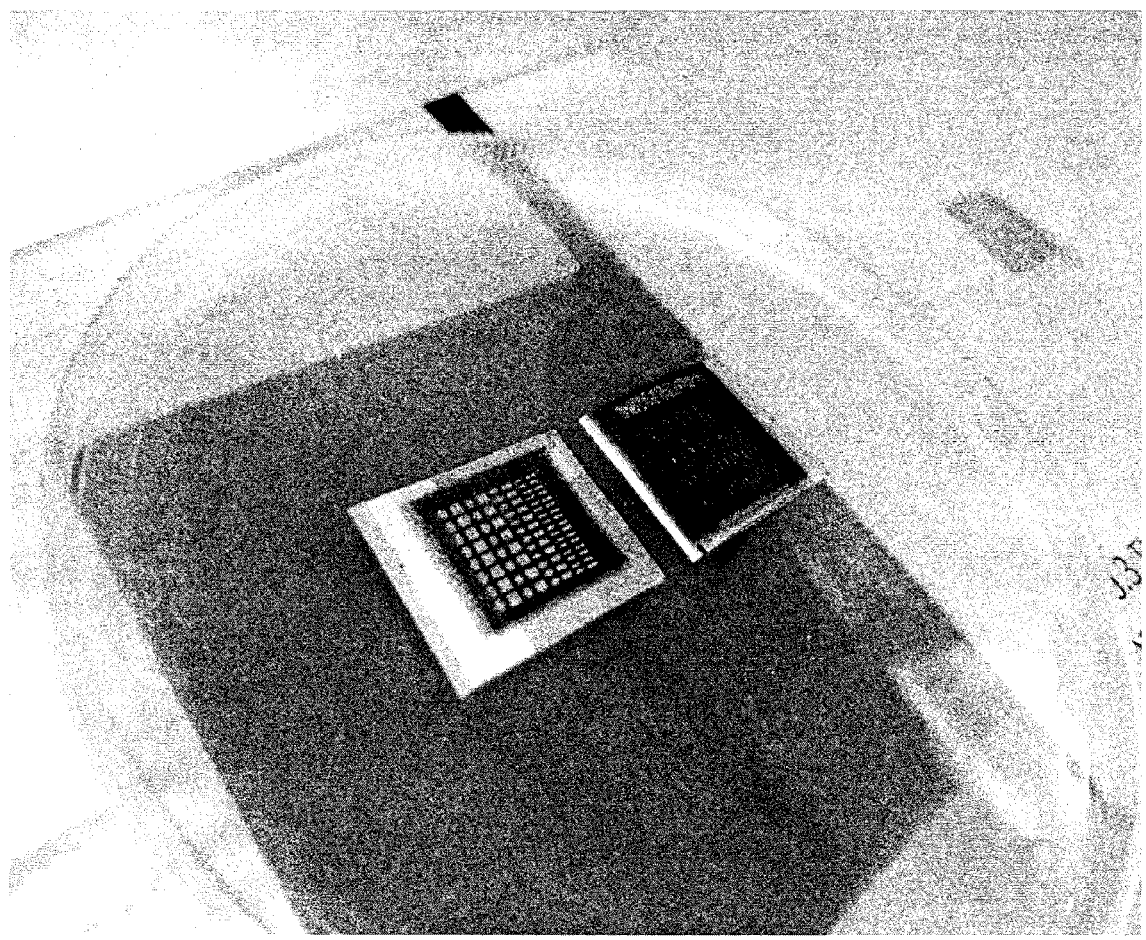
FIG. 8 illustrates a mylar film adhered over device surfaces to serve as the gate dielectric according to some embodiments described herein.
Figure 9:
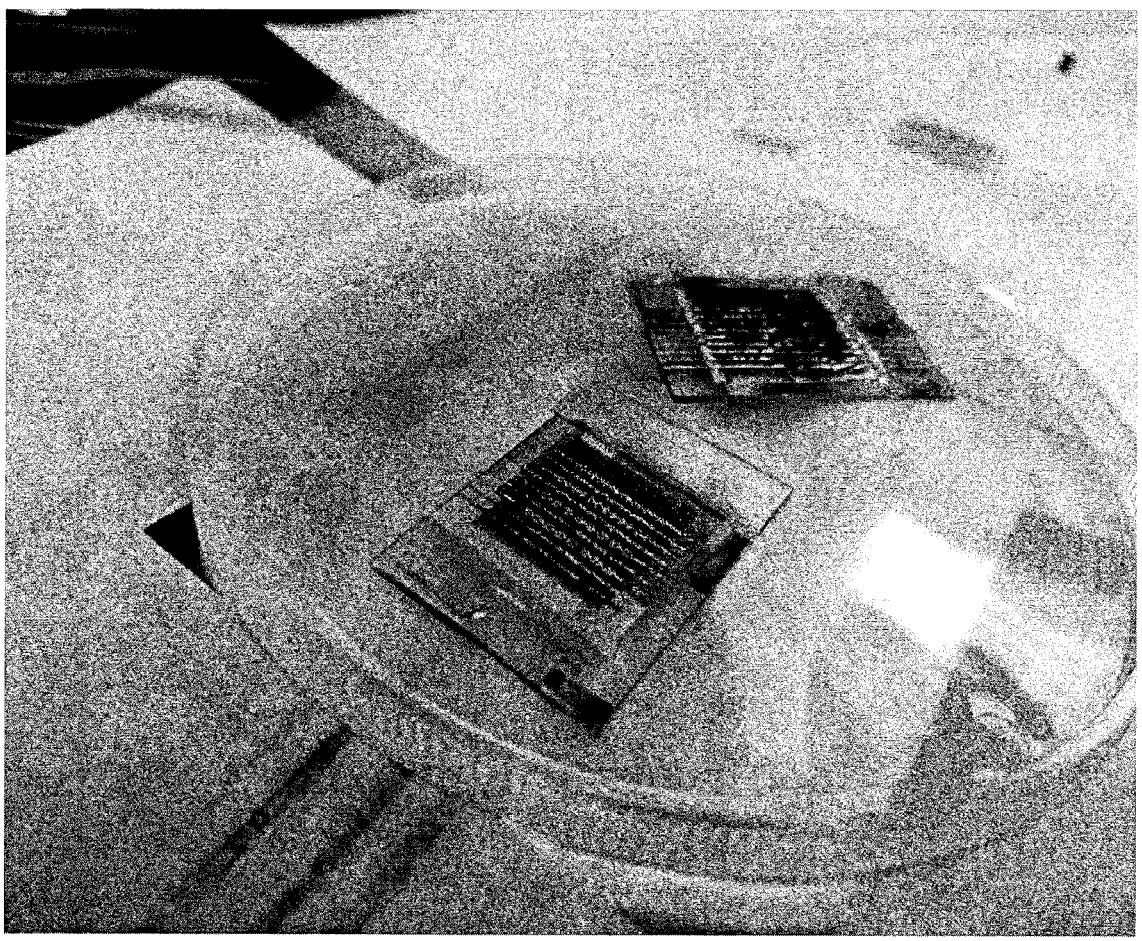
FIG. 9 illustrates gold gate electrodes thermally evaporated through a slotted shadow mask such that the electrodes overlapped the transistor channels underneath according to some embodiments described herein.

Gold source and drain contacts were thermally evaporated on top of the waxy OSC toner layer through metal foil shadow masks as illustrated in FIG. 7. Alternatively, the source and drain contacts can be deposited on the waxy paper before the OSC toner is printed such that the contacts would be under the OSC layer (bottom contacts). A layer of 2.5 µm mylar was adhered over the surface using spray adhesive to serve as the gate dielectric as illustrated in FIG. 8. Gold gate electrodes were thermally evaporated through a slotted shadow such that the electrodes overlapped the transistor channels underneath as illustrated in FIG. 9.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A particulate organic semiconductor composition comprising:
    a semiconductor component including particulate organic small molecule semiconductor, particulate polymeric semiconductor or mixtures thereof; and
    a particulate carrier comprising toner, wherein the particulate organic semiconductor composition can be applied to a substrate by laser printing.

2. The particulate organic semiconductor composition of claim 1, wherein the semiconductor component comprises one or more acenes.

3. The particulate organic semiconductor composition claim 1, wherein the particulate organic small molecule semiconductor is of Formula (I):

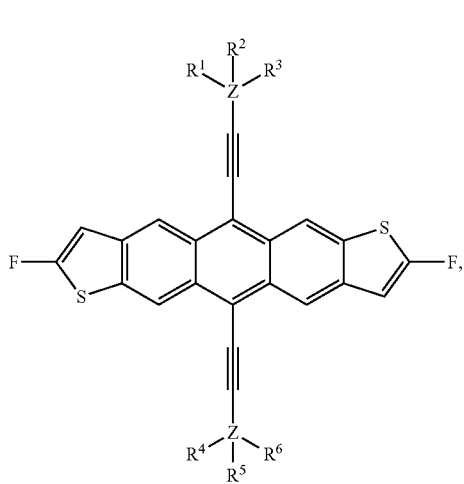

(I)

wherein Z is selected from the group consisting of Si and Ge and $R^1$-$R^6$ are independently selected from the group consisting of $C_{1-20}$ alkyl and $C_{1-20}$ alkenyl.

4. The particulate organic semiconductor composition claim 1, wherein the particulate organic small molecule semiconductor is of Formula (II):

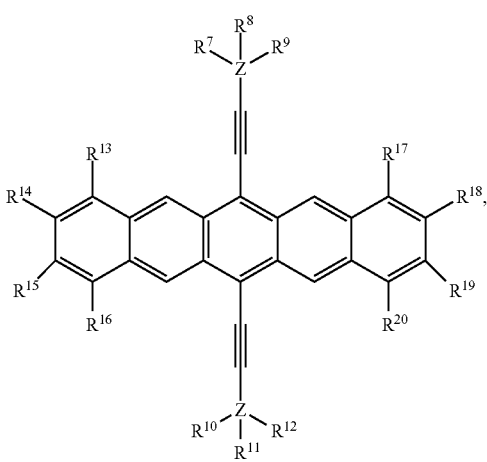

(II)

wherein Z is selected from the group consisting of Si and Ge and $R^7$-$R^{12}$ are independently selected from the group consisting of $C_{1-20}$ alkyl and $C_{1-20}$ alkenyl and $R^{13}$-$R^{20}$ are independently selected from the group consisting of hydrogen, halogen, cyano, alkyl, alkenyl, alkynyl, aryl and heteroaryl.

5. The particulate organic semiconductor composition of claim 1, wherein a ratio of the particulate carrier to semiconductor component ranges from 0.5:10 to 10:0.5.

6. The particulate organic semiconductor composition of claim 1 further comprising a charge control additive.

7. The particulate organic semiconductor composition of claim 6, wherein the charge control additive comprises fumed silica or derivative thereof.

8. A method of fabricating an organic electronic device comprising:

providing a particulate organic semiconductor composition including an organic semiconducting component and a particulate carrier;
depositing the particulate organic semiconductor composition on one or more selected regions of a charged photoreceptor drum of a printer;
transferring the particulate organic semiconductor composition from the photoreceptor drum to a substrate of the electronic device; and
fusing particles of the organic semiconductor composition, wherein the organic semiconducting component comprises a particulate organic small molecule semiconductor, particulate polymeric semiconductor or mixture thereof, and wherein
the particulate carrier comprises a toner.

9. The method of claim 8, wherein the organic semiconductor component comprises one or more acenes.

10. The method of claim 8, wherein the organic semiconductor composition further comprises a charge control additive.

11. The method of claim 8, wherein fusing the particles melts the organic semiconductor composition.

12. The method of claim 8, wherein fusing the particles heats the organic semiconductor composition to glass transition temperature of the organic semiconductor composition or above the glass transition temperature without melting the organic semiconductor composition.

13. The method of claim 11 or 12, wherein the organic semiconducting component undergoes recrystallization or zone refinement upon cooling.

14. The method of claim 8, wherein the electronic device is a thin film transistor, and the fused semiconductor composition forms a channel of the transistor.

15. The method of claim 8, wherein the electronic device is a photovoltaic and the fused semiconductor composition forms a photoactive layer of the photovoltaic.

16. The method of claim 8, wherein the substrate is a dielectric material.

17. The method of claim 8, wherein the substrate comprises cellulosic material.

18. The method of claim 17, wherein the substrate is paper.

19. The method of claim 8, wherein the substrate has thickness of 1 μm to 10 μm.

20. The method of claim 8, wherein the particulate organic small molecule semiconductor is of Formula (I):

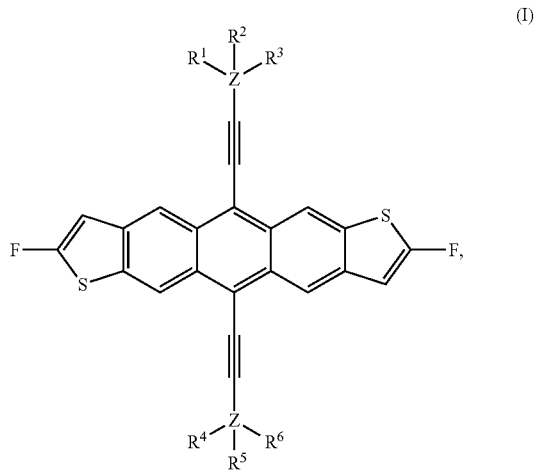

(I)

wherein Z is selected from the group consisting of Si and Ge and $R^1$-$R^6$ are independently selected from the group consisting of $C_{1-20}$ alkyl and $C_{1-20}$ alkenyl.

21. A particulate organic semiconductor composition comprising:
   a semiconductor component including particulate organic small molecule semiconductor; and
   a particulate carrier, wherein the particulate organic semiconductor composition can be applied to a substrate by laser printing and wherein the particular small molecule semiconductor; is of Formula (I):

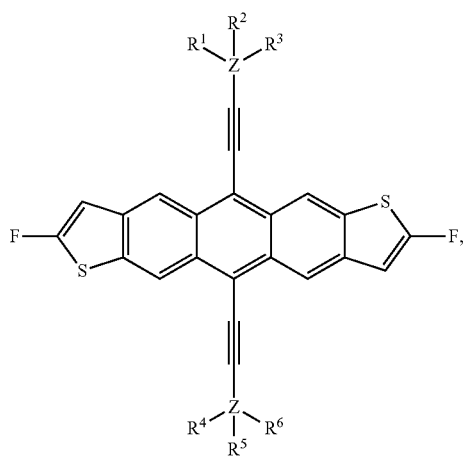

(I)

wherein Z is selected from the group consisting of Si and Ge and $R^1$-$R^6$ are independently selected from the group consisting of $C_{1-20}$ alkyl and $C_{1-20}$ alkenyl.

22. A particulate organic semiconductor composition comprising:
   a semiconductor component including particulate organic small molecule semiconductor; and
   a particulate carrier, wherein the particulate organic semiconductor composition can be applied to a substrate by laser printing and wherein the particular small molecule semiconductor is of Formula (II):

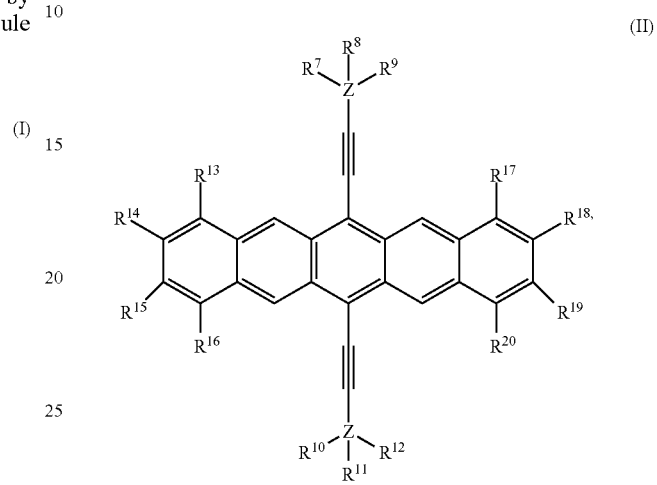

(II)

wherein Z is selected from the group consisting of Si and Ge and $R^7$-$R^{12}$ are independently selected from the group consisting of $C_{1-20}$ alkyl and $C_{1-20}$ alkenyl and $R^{13}$-$R^{20}$ are independently selected from the group consisting of hydrogen, halogen, cyano, alkyl, alklenyl, alkynyl, aryl and heteroaryl.

* * * * *